United States Patent [19]

Dupuis

[11] 4,203,698
[45] May 20, 1980

[54] APPARATUS FOR SIMULTANEOUSLY LOADING A MULTIPLICITY OF PINS INTO A LOADING FIXTURE FOR A PIN INSERTION MACHINE

[75] Inventor: Jean M. Dupuis, Ottawa, Canada

[73] Assignee: Northern Telecom Limited, Montreal, Canada

[21] Appl. No.: 919,666

[22] Filed: Jun. 27, 1978

[51] Int. Cl.² .............................................. H05K 3/30
[52] U.S. Cl. .................................... 414/404; 29/739; 221/94; 221/312 R; 414/415; 414/417
[58] Field of Search ................. 414/404, 415, 417, 17, 414/18; 29/739, 809–817; 221/93, 94, 243, 312, 312 R; 53/151, 236

[56] References Cited

U.S. PATENT DOCUMENTS 2,682,983 7/1954 Ashcroft ........................... 221/93 X
4,102,043 7/1978 Andrade et al. ..................... 29/739

Primary Examiner—Robert G. Sheridan
Attorney, Agent, or Firm—Sidney T. Jelly

[57] ABSTRACT

Apparatus for loading contact pins into a loading fixture, the pins in two or more rows, has a magazine for holding pins in a plurality of vertically stacked rows. Automatic insertion members push pins from the magazine into the loading fixture. The number of pins, and disposition of the pins, in a row can be predetermined by a template. The pins are swaged at a position intermediate the ends and thus do not stack level in the magazine. The magazine is provided with a stepped formation so as to offset the effect of the swage and provide for pins to be horizontal at the levels at which they are to be inserted into the loading fixture. Small rings of solder can be positioned on the pins prior to insertion in the board.

5 Claims, 11 Drawing Figures

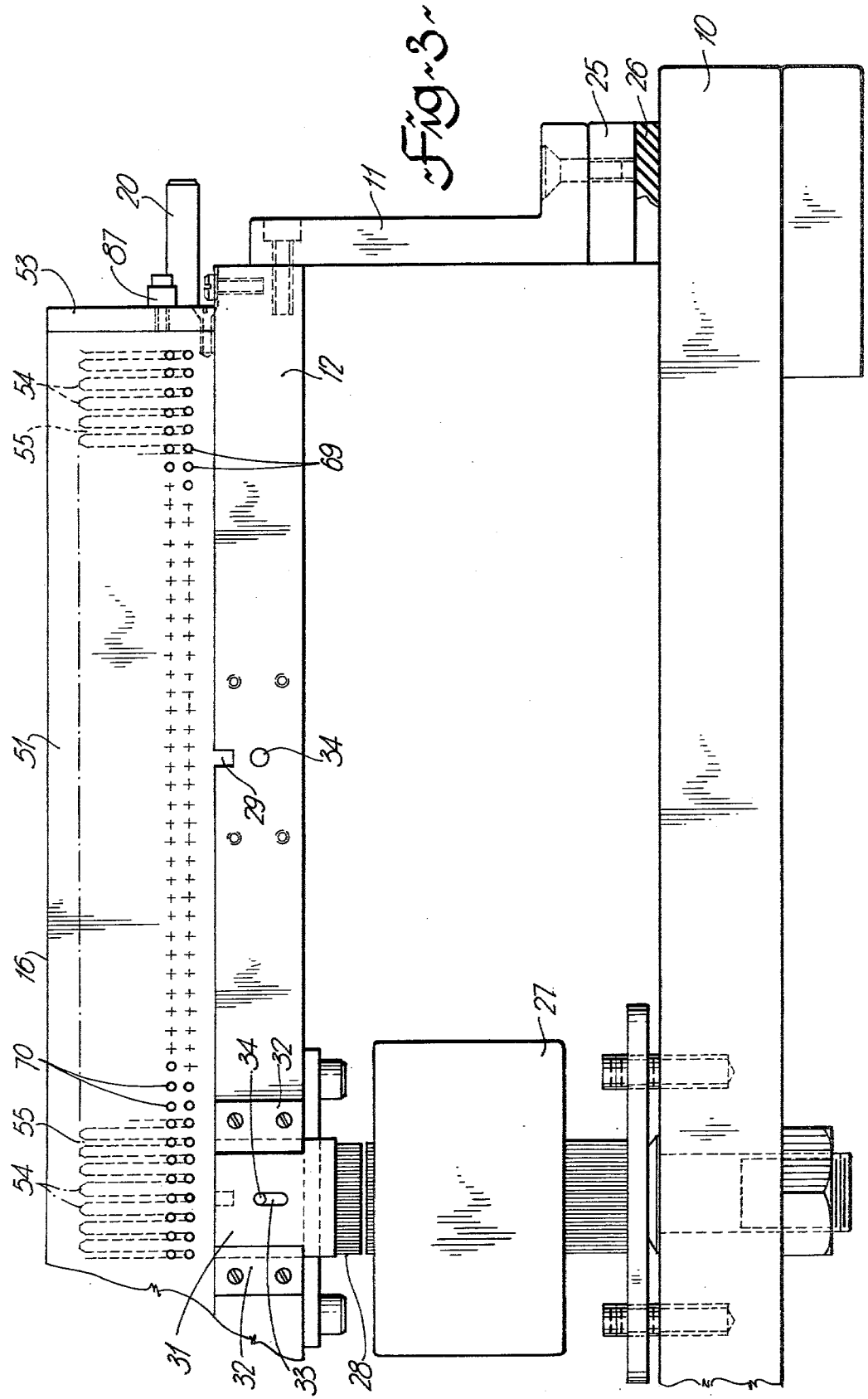

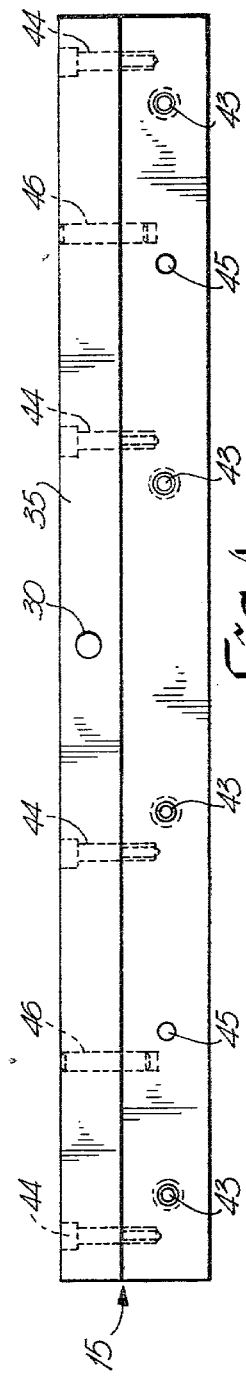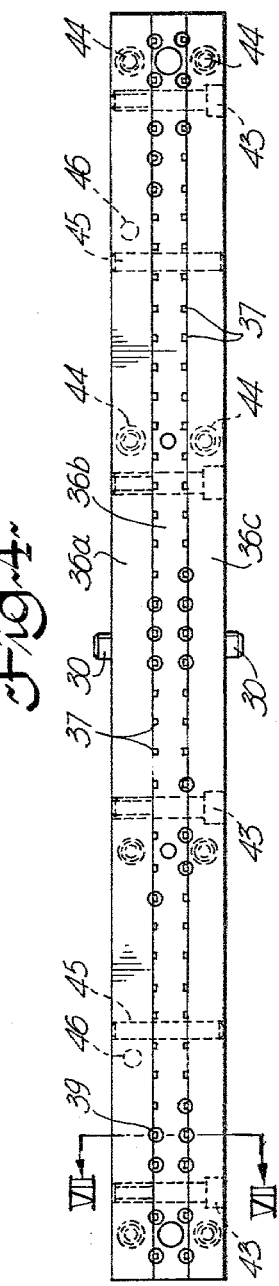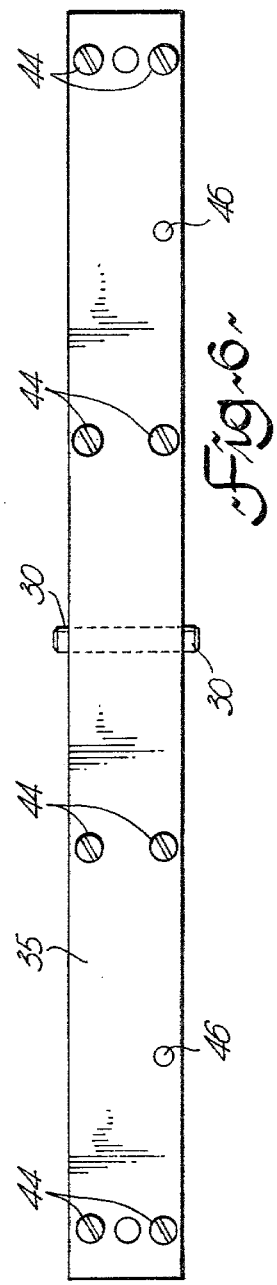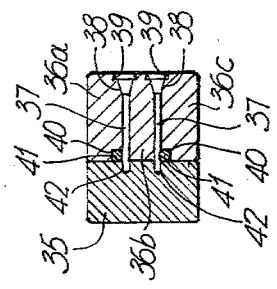

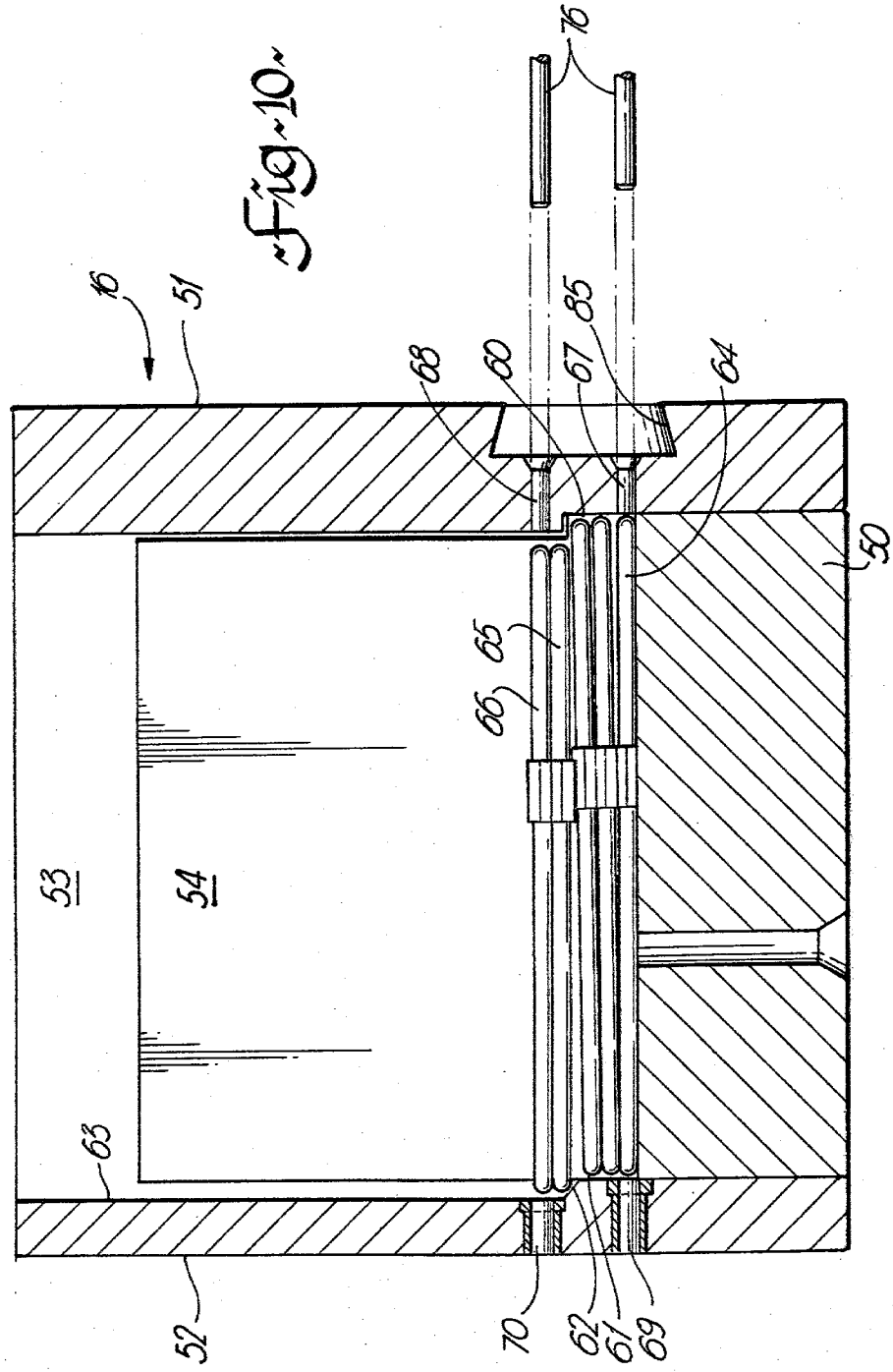

APPARATUS FOR SIMULTANEOUSLY LOADING A MULTIPLICITY OF PINS INTO A LOADING FIXTURE FOR A PIN INSERTION MACHINE

This invention relates to apparatus for simultaneously loading a multiplicity of pins in a loading fixture for a pin insertion machine.

In present day technology, for example telecommunications and other electrical and electronic systems, printed circuit boards and other forms of circuit boards are used, electrical connection being made to such boards via pins inserted at one end, or one side, of the board. The pins connect with various circuits and/or circuit items on the board.

A consideration number of pins may be inserted in a board and insertion singly is a long job and is of high labour content. The pins may be in more than one row which further complicates the insertion of pins.

The present invention provides for the insertion of a large number of pins into a loading fixture, in two or more rows, simultaneously. The pins are usually swaged or otherwise preformed at a position intermediate the ends and this makes stacking the pins in a holding magazine difficult, as they tend to tilt and will not therefore align with holes in a loading fixture. The invention provides stacking arrangement in which the variation in pin size is allowed for. The pins are inserted into a loading fixture for transfer to an insertion press. It occurs that the particular number and positioning of the pins varies for different boards and in accordance with one feature of the invention that means are provided for selectively preventing loading of pins at positions where pins are not required in the board. The loading fixture can be removed from the loading apparatus and positioned in a press, with a board, for insertion of the pins into the board at one stroke of the press.

The invention will be readily understood by the following description of certain embodiments of the invention, by way of example, in conjunction with the accompanying drawings, in which:

FIG. 3 is a front view, in the direction of arrow A in FIG. 1, of one end of the apparatus;

FIGS. 4, 5 and 6 are respectively top, back and front views of a loading fixture for loading in the apparatus of FIGS. 1, 2 and 3;

FIG. 7 is a cross-section on the line VII—VII of FIG. 5;

FIG. 10 is a cross-section, to an enlarged scale, on the line X—X of FIG. 2.

Figure 1:
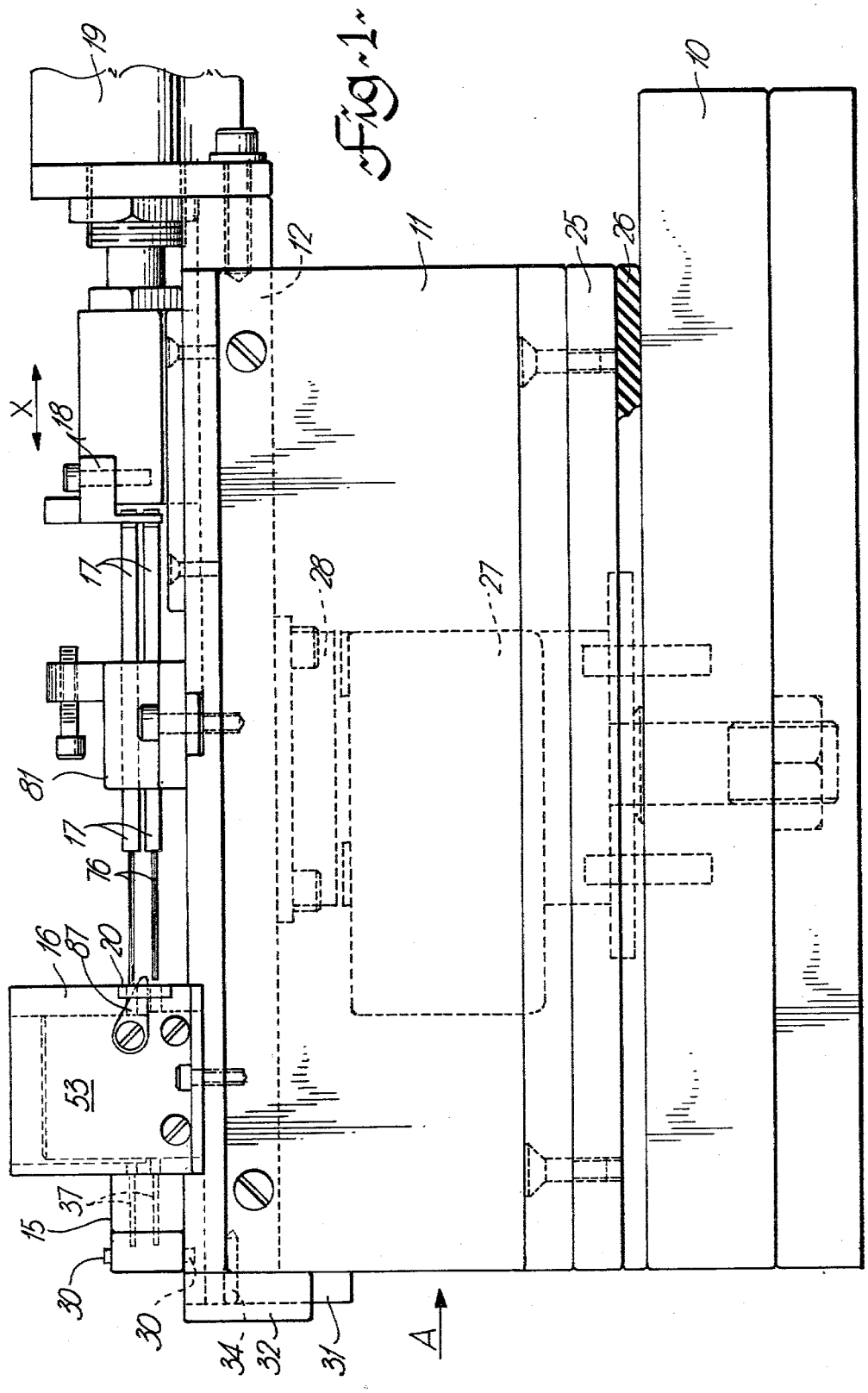
FIG. 1 is a side view of one form of apparatus.

Illustrated in FIGS. 1 and 3 is a base 10, and bracket 11, a similar bracket, not shown, being provided at the other end and a top support plate 12. Positioned on the support plate 12, from left to right in FIG. 1, is a loading fixture 15, magazine or hopper 16, spring loaded inserting members 17, pusher 18 and hydraulic or pneumatic ram 19. The loading fixture 15 is omitted from FIG. 2, and also from FIG. 3. Also shown in FIGS. 1 and 3 is a template 20.

The end brackets 11 are attached to the base 10 via a metal spacer 25 to which is bonded a rubber spacer 26 also being bonded to the base 10. This provides a flexible mounting of the support plate 12 on the base 10. This is provided as a vibrator 27 is mounted on the base with an armature 28 on the support plate, to provide an electro-magnetic vibration of the support plate at predetermined times. Normally, the vibrator is actuated for a short time, for example about 1/n second, after each time a loading fixture is filled with pins, to ensure pins move down in the magazine 16.

The support plate 12 has grooves 29 in its upper surface, the grooves cooperating with dowels 30 extending from the loading fixture 15 to accurately locate the loading fixture relative to the magazine 16.

Along the front of the support plate 12 are a number of virtically slidable members 31, held by guides 32. A slot 33 in the face of the slidable member cooperates with a dowel 34 extending from the support plate 12 to limit movement of the slidable member. Once the loading fixture is in position on the support plate, the slidable members are pushed up to hold the loading fixture against the magazine or hopper 16. As an example three slidable members 31 can be provided but only one is illustrated in FIG. 3, and one is omitted for clarity, the dowel 34 being seen.

Considering now the various items in detail, the loading fixture 15 is illustrated in more detail in FIGS. 4, 5, 6 and 7. The fixture, in the example, is formed from four parts, what can be termed a base part 35 and a top part in three sections 36a, 36b and 36c connected together in a sandwich configuration and also attached to the base part 35. The forming of the top part in three sections simplifies the forming of the holes 37. Holes 37 are for the reception of pins, of square cross-section, and would be difficult and costly to form in a solid top part. Conveniently the holes 37 are formed on either side of the centre section 36b. After assembly of the three sections, the holes are countersunk, at 38, on the back surface 39, and can also be recessed, at 39, for reception of a ring of solder, as will be described later. A longitudinally extending groove 40 is formed on the inner corner of each outer section, 36a and 36c, at the other end of the countersinks 38, and a strip of rubber 41 or similar material, placed therein prior to assembly of the top and base parts. The rubber strips extend slightly into the holes 37 and frictionally grip the pins inserted into the holes. Longitudinally extending slots or grooves 42 are formed in the base part 35, aligned with the holes 37, for reception of the pin ends. The depth of the slots 42 determines the inserted position of the pins into the fixture. The various pieces of the fixture are held together by screws 43 and 44, with accurate location of dowels 45 and 46.

Figure 2:
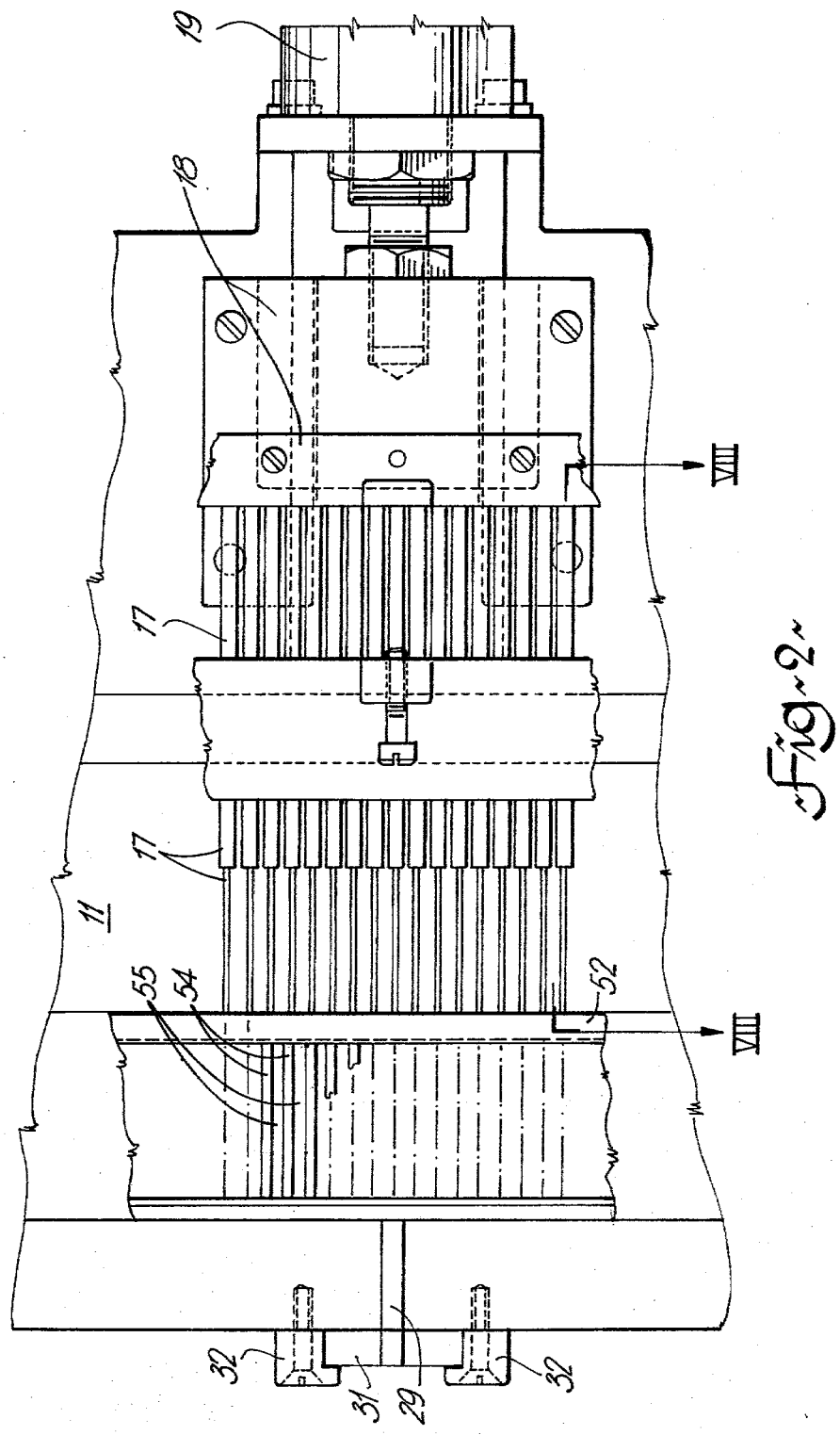
FIG. 2 is a partial top view of the apparatus of FIG. 1.

The magazine 16 is seen in FIGS. 1, 2 and 3, and is illustrated in cross-section at a larger scale in FIG. 10. The magazine is in the form of an elongated box-like member, having a base 50, back and front wall 51 and 52, and ends 53. The base 50, which fits between the front and back walls, has a plurality of parallel webs or dividers 54. The dividers extend normal to the length of the magazine and are spaced apart to provide vertical compartments or slots 55 the width of a pin.

To provide for a force fit in a board, or other member, the pins are swaged, or similarly deformed at a position intermediate their ends, to give an increased dimension. Due to this swaging the pins will not stack evenly, or level, in the slots 55. While this does not materially affect the bottom-most pin, which can be inserted into the bottom row of the fixture, some provision is necessary to ensure alignment of the pin which is to be inserted in the second row of the fixture.

The magazine is formed so as to divide the column of pins in a slot into two parts, a lower part and an upper part. As illustrated in FIG. 10, the front and back walls 51 and 52 are formed with a transverse offset a short distance above the upper surface of the base 50. Thus, the front wall 51 is recessed or undercut at 60, while the rear wall 52 projects at 61, the same distance as the undercut at 60. An inclined surface 62 joins the lower, projecting surface 61, with the upper surface 63 of the rear wall. As pins initially fall into a slot they will pass down the upper part, one end will hit the inclined surface 62, and the pins will move forward and down again until the lower part is filled. The next pin will not be able to pass into the undercut 60 and will lodge on the inclined surface 62 while further pins will then pile up. The lowest pin, indicated at 64 in FIG. 10 is in the correct position, and in the example illustrated, two more pins sit on pin 61 and then the next pin, 65, is offset rearward. The next pin 66 is then the one, in this example, correctly positioned. This arrangement can be repeated if more than two rows of pins are to be inserted into a loading fixture.

For transfer of the pins from the magazine 16 to the loading fixture 15 holes are formed through the front and rear walls 51 and 52. Two rows of holes 67 and 68 are formed in the front wall 51, the lower row of holes 67 being in the undercut portion 60 and immediately above the base 50. These holes will be aligned with the bottom pins 64. The second row of holes 68 is just above the undercut and these holes will be aligned with pins 66. Similarly, in the back wall 52 two rows of holes 69 and 70 are formed. The bottom row of holes 69 is immediately above the base 50 and each hole is aligned with the bottom pin 64 in each slot 55. The second row of holes is just above the inclined surface 62 with the holes aligned with the pins 66. The number of pins between pin 64 and pin 66 in each slot depends upon the pitch between the two rows of holes 37 in the loading fixture 15.

Figure 8:
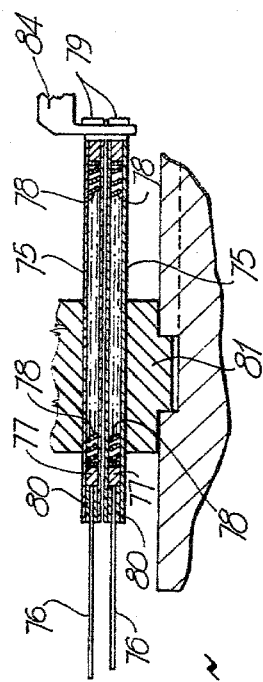
FIG. 8 is a cross-section on the line VIII—VIII of FIG. 2.

The pins are transferred from the magazine 16 to the fixture 15 by the insertion members 17. The insertion members are illustrated in FIG. 2 and are seen in more detail in FIG. 8. Each member 17 comprises an outer tubular housing 75 and a pin 76 mounted on a piston 77 sliding axially inside the housing 75. A compression spring 78 extends between the piston 77 and an end cap 79. The pin 76 extends from the tubular housing through a guide 80 in the end of the housing 75 remote from the end cap 79. In the present example the insertion members are slidably supported in two rows in a support member 81, aligned with the holes 67 and 68 of the magazine 16. The ends of the pins 76 are seen in FIG. 10.

The insertion members are moved axially by the pusher 18. The pusher has a downwardly extending flange 84 in which vertical slots are cut. The end caps 79 are grooved and slide up into the slots in the flange 84. Thus movement of the pusher back and forth, as arrow X in FIG. 1, will move the insertion members back and forth.

Figure 9A:
FIGS. 9a and 9b are front views of two alternative forms of turnplate for selection of pin loading pattern.
Figure 9B:
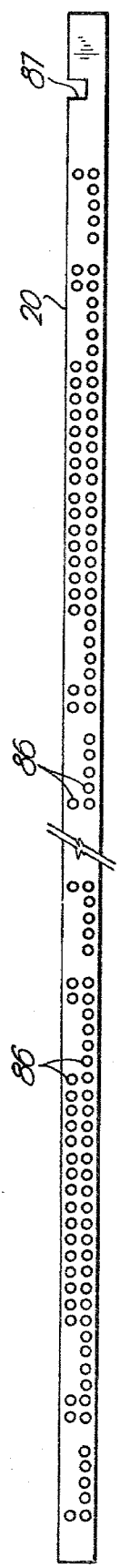

The compression springs 78 are sufficiently strong to push the pins from the magazine 16 into the fixture 15 without collapsing. However, it may well be that, as previously stated, a pin pattern on a board may not require two complete rows of pins. In such cases pins will require to be omitted from corresponding holes 37 in the fixture and thus pins will not be transferred from the magazine 16 to the fixture 15. The transfer of pins is prevented by the use of a template - 20 in FIGS. 1 and 3. The template, of trapezoidal cross-section, slides into a correspondingly shaped slot 85 in the front face of the front wall 51 of the magazine 16. This slot is seen clearly in FIG. 10. Two particular templates are illustrated in FIGS. 9a and 9b. FIG. 9a for the insertion of pins in two rows in two sections, with no pins omitted in either row in either section. FIG. 9b is for an insertion arrangement where certain pins are to be omitted. The number of pins to be inserted, and the particular pattern, can vary considerably, with a suitable pattern of holes 86.

The template 20 is slid into the slot 85 and is located, and held, in the correct position by a lever 87 attached to one end of the magazine 16, the lever 87 fitting into a groove 87 in the template 20. The template acts as follows: when the apparatus is actuated, that is the ram 19 operates, the pusher 18 moves pushing the insertion members 17. When a hole 86 is in the template, the pin 76 of an insertion member will pass through the hole, through one of the holes 67 or 68 in the front wall 51 of the magazine and push a pin, 64 or 66, out through hole 69 or 70 into a hole 37 in the loading fixture 15. If there is no hole in the template, then the pin 76 slides back into the tubular housing 75, collapsing the spring 78. After transfer of the pins from the magazine 16 to the fixture 15, the ram 19 retracts withdrawing the pusher 18. Pins move down in the slots 55 in the magazine, assisted by a short cycle of the vibrator 27.

The cycle is very short, a fixture is placed on the support plate 12, located by dowels 30 and slots 29, the ram 19 actuated, transfer of pins occurs, ram 19 retracts and the fixture is removed. The pins are held in the fixture by the rubber members 41.

The loading fixture, loaded with pins, is then capable of transfer to an insertion press. Generally the fixture is inserted, with the pins projecting downwards a predetermined amount from the fixture, and positioned in a press, a printed circuit board or other member positioned beneath and the press actuated to push down fixture and pins, the pins pushed into holes in the board or other member. The swaged or deformed portion of each pin is external of the fixture and it is this portion which is pressed into the board or other member, being a tight press fit in the related hole. On the return stroke of the press, the holding fixture is pulled off of the pins, the friction holding of the rubber members 41 being less than the grip of the board or other member on the swaged portions of the pins.

As an addition, small rings of solder can be positioned on the pins, a ring on each pin, before inertion in the board or other member. The rings of solder fit into the recesses 39, FIG. 7, as described above. To fit the solder rings on the pins, a flat plate is provided with holes drilled therein to conform with the holes 37 in the fixture. The top of each hole is recessed, similar to the recesses 39, and small solder rings are dropped on to the flat plate and scraped across until a ring of solder drops into each recess, excess rings being pushed to one side. The holding fixture, with pins in position, is inserted over the plate, the pins pushed down into the holes, until the solder rings are pushed onto the swaged portions, where they are held. Locating means can be provided for the flat plate to locate the holding fixture relative to the plate. A wide plate can be used with sufficient holes to enable several holding fixtures to be positioned over the plate at one time and then all pushed down together.

When the pins have been inserted into the board, or other member, the solder rings are in contact with the board and an application of heat to the pins, the solder melts and connects the pins to associated parts of a circuit.

What is claimed is:

1. Apparatus for simultaneously loading a multiplicity of pins into a loading fixture for a pin insertion machine, comprising:

a support plate;

means for locating and holding a loading fixture on said support plate, said fixture having two rows of holes for receiving and holding pins;

a magazine on said support plate and having a plurality of vertical compartments, for holding pins in vertical rows, said compartments spaced to be aligned with the pin receiving holes of a loading fixture;

a plurality of elongate insertion members slidably mounted on said support plate, said insertion members arranged in two rows, an insertion member axially aligned with each compartment in said magazine, each insertion member comprising a tubular housing, a piston axially slidable in said housing and a pin extending axially from said piston out of said housing, and a compression spring behind said piston, and means for holding a template between said insertion member and said compartments in said magazine, said template having a predetermined pattern of holes therein corresponding to a predetermined distribution of pins to be inserted in said holding fixture, the arrangement such that an axial movement of said insertion members, the piston and associated pin can retract against said spring when a hole is not present in a turnplate whereby a pin is not transferred from said magazine to said holding fixture; and actuating means for moving said elongate insertion members axially, whereby the insertion members enter said magazine and push a pin out of each compartment into a corresponding pin receiving hole in the loading fixture.

2. Apparatus as claimed in claim 1, including means on said magazine for positioning and holding said template.

3. Apparatus as claimed in claim 1, said magazine comprising an elongate box-like member having a base and back and front walls, the front wall facing towards said insertion members and said back wall facing toward the loading fixture position, said webs extending between said walls to form said compartments, a first row of entry holes in said front wall, and aligned with a lower row of insertion members and positioned to be aligned with a lower pin resting on said base of the magazine in each compartment and a first row of exit holes in the back wall and positioned to be aligned with said lower pin; a second row of entry holes in said front wall, aligned with an upper row of insertion members and positioned to be aligned with a an upper pin positioned at a predetermined level in each compartment and a second row of exit holes in the back wall and positioned to be aligned with said upper pin positioned at said predetermined level; and means for positioning a pin in each compartment at said predetermined level.

4. Apparatus as claimed in claim 3, said means for positioning a pin in each compartment at said predetermined level, comprising:

a first offset, on the inner side of said front wall to form an undercut formation extending along said front wall and upward from said base a predetermined distance and to accept a predetermined number of pins;

a second offset, on the inner side of said back wall to form a projection extending along said back wall and upward from said base, said projection having an upper surface inclined downwardly and inwardly, the projection extending upwardly to a position with said inclined upper surface at substantially the same level as the top of said undercut portion;

the arrangement such that on loading pins into said magazine, said predetermined number of pins move down each compartment and sequentially move forward to lie between said undercut and said projection, and the next pin extends between said inclined surface of said projection and the front wall immediately above said undercut, whereby a succeeding pin resting on said next pin is supported level and at a position aligned with said upper entry and exit holes in said front and back walls.

5. Apparatus as claimed in claim 1, including a vibrator connected to said support plate, said vibrator actuated for a predetermined time after each actuation of said actuating means.

* * * * *